United States Patent
Takashima et al.

(10) Patent No.: US 8,772,751 B2
(45) Date of Patent: Jul. 8, 2014

(54) VARIABLE RESISTANCE SEMICONDUCTOR MEMORY DEVICE

(75) Inventors: Akira Takashima, Fuchu (JP); Daisuke Matsushita, Fuchu (JP); Takashi Yamauchi, Fuchu (JP); Yuuichi Kamimuta, Fuchu (JP); Hidenori Miyagawa, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 13/234,388

(22) Filed: Sep. 16, 2011

(65) Prior Publication Data
US 2012/0243292 A1    Sep. 27, 2012

(30) Foreign Application Priority Data
Mar. 22, 2011 (JP) .................. 2011-063353

(51) Int. Cl.
*H01L 47/00* (2006.01)
*H01L 45/00* (2006.01)

(52) U.S. Cl.
CPC ..................... *H01L 45/04* (2013.01)
USPC ................................. 257/4; 257/2

(58) Field of Classification Search
CPC ....................................... H01L 45/04
USPC ................................................ 257/4
See application file for complete search history.

(56) References Cited

U.S. PATENT DOCUMENTS

| 5,541,869 A * | 7/1996 | Rose et al. ................ 365/100 |
| 8,374,018 B2 | 2/2013 | Lu |
| 2006/0054961 A1 * | 3/2006 | Suzuki et al. ............... 257/310 |
| 2006/0246651 A1 * | 11/2006 | Chambers et al. .......... 438/216 |
| 2007/0246764 A1 * | 10/2007 | Herner ...................... 257/309 |
| 2009/0014707 A1 | 1/2009 | Lu et al. |
| 2010/0213550 A1 * | 8/2010 | Kanno et al. .............. 257/379 |

FOREIGN PATENT DOCUMENTS

| JP | 6-204341 A | 7/1994 |
| JP | 2006-339642 A | 12/2006 |
| JP | 2007-329274 A | 12/2007 |
| JP | 2008310858 A * | 12/2008 |
| JP | 2010-199181 A | 9/2010 |
| JP | 2012-28765 A | 2/2012 |

OTHER PUBLICATIONS

Sung Hyun Jo et al., "CMOS Compatible Nanoscale Nonvolatile Resistance Switching Memory", Nano Letters, vol. 8, No. 2, 2008, pp. 392-397.

Office Action issued Jun. 25, 2013, in Japanese Patent Application No. 2011-063353 with English translation.

* cited by examiner

*Primary Examiner* — Ajay K Arora
(74) *Attorney, Agent, or Firm* — Oblon, Spivak, McClelland, Maier & Neustadt, L.L.P.

(57) ABSTRACT

According to one embodiment, a memory device includes a first electrode including a crystallized $Si_xGe_{1-x}$ layer ($0 \leq x < 1$), a second electrode including a metal element, a variable resistance part between the first and second electrode, the part including an amorphous Si layer, and a control circuit controlling a filament in the amorphous Si layer, the filament including the metal element.

19 Claims, 14 Drawing Sheets

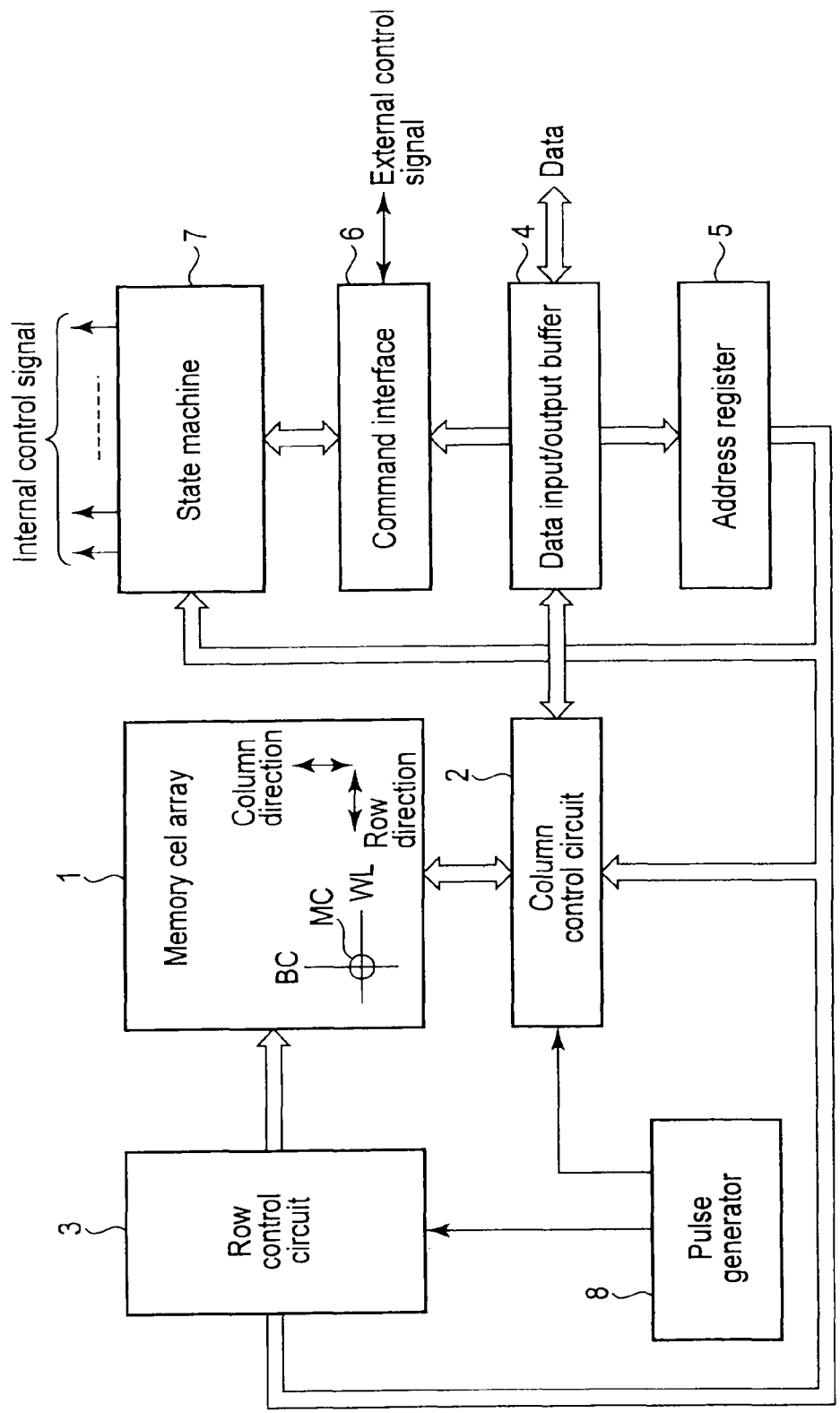
F I G. 1

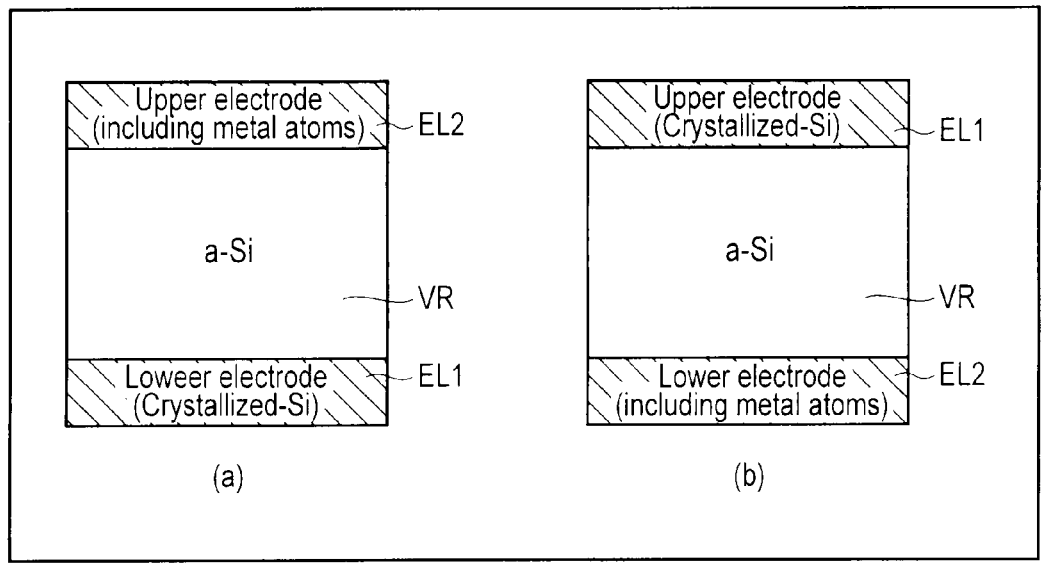
F I G. 4
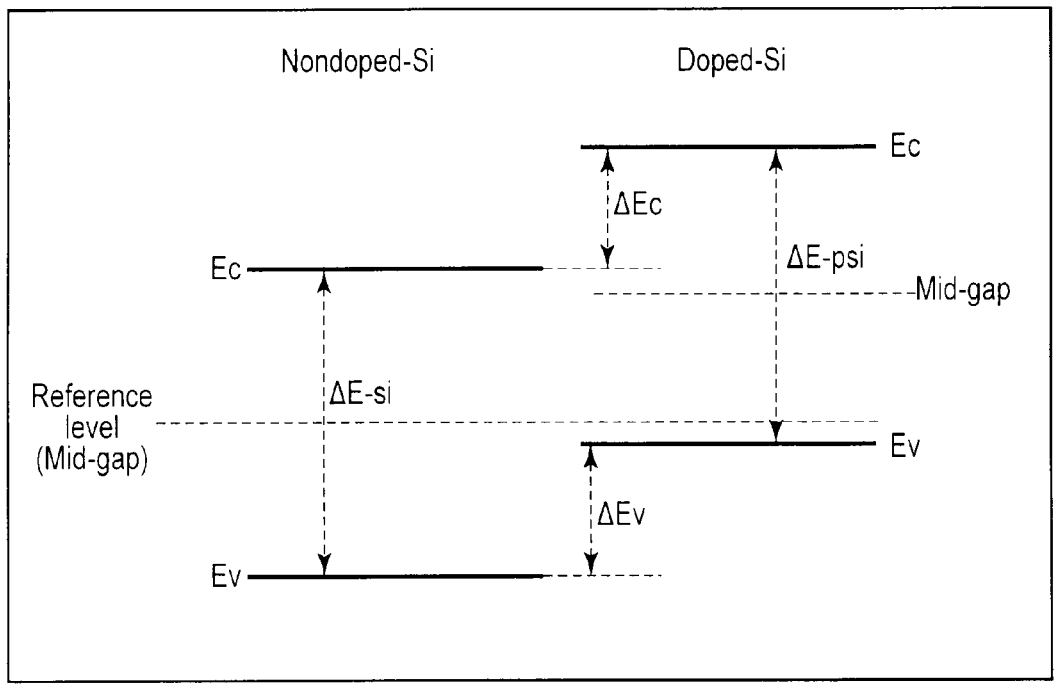
F I G. 5

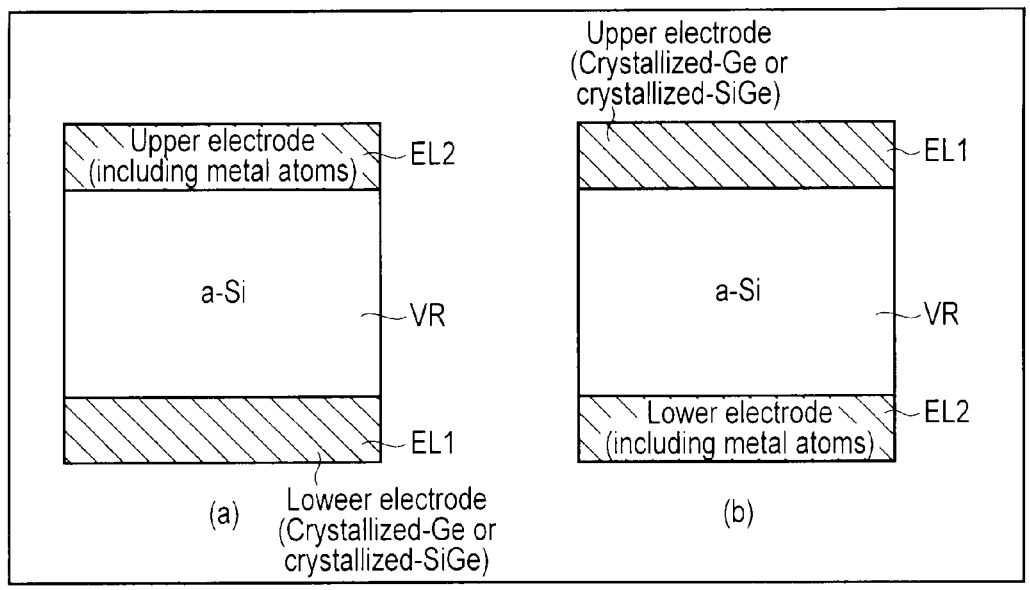
F I G. 6
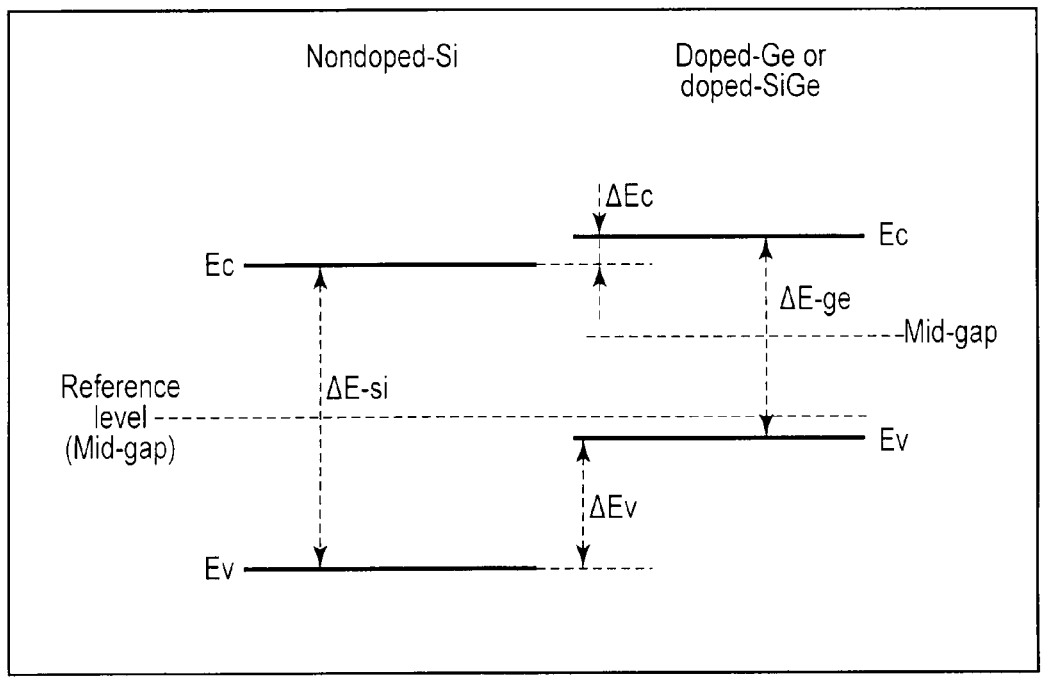
F I G. 7

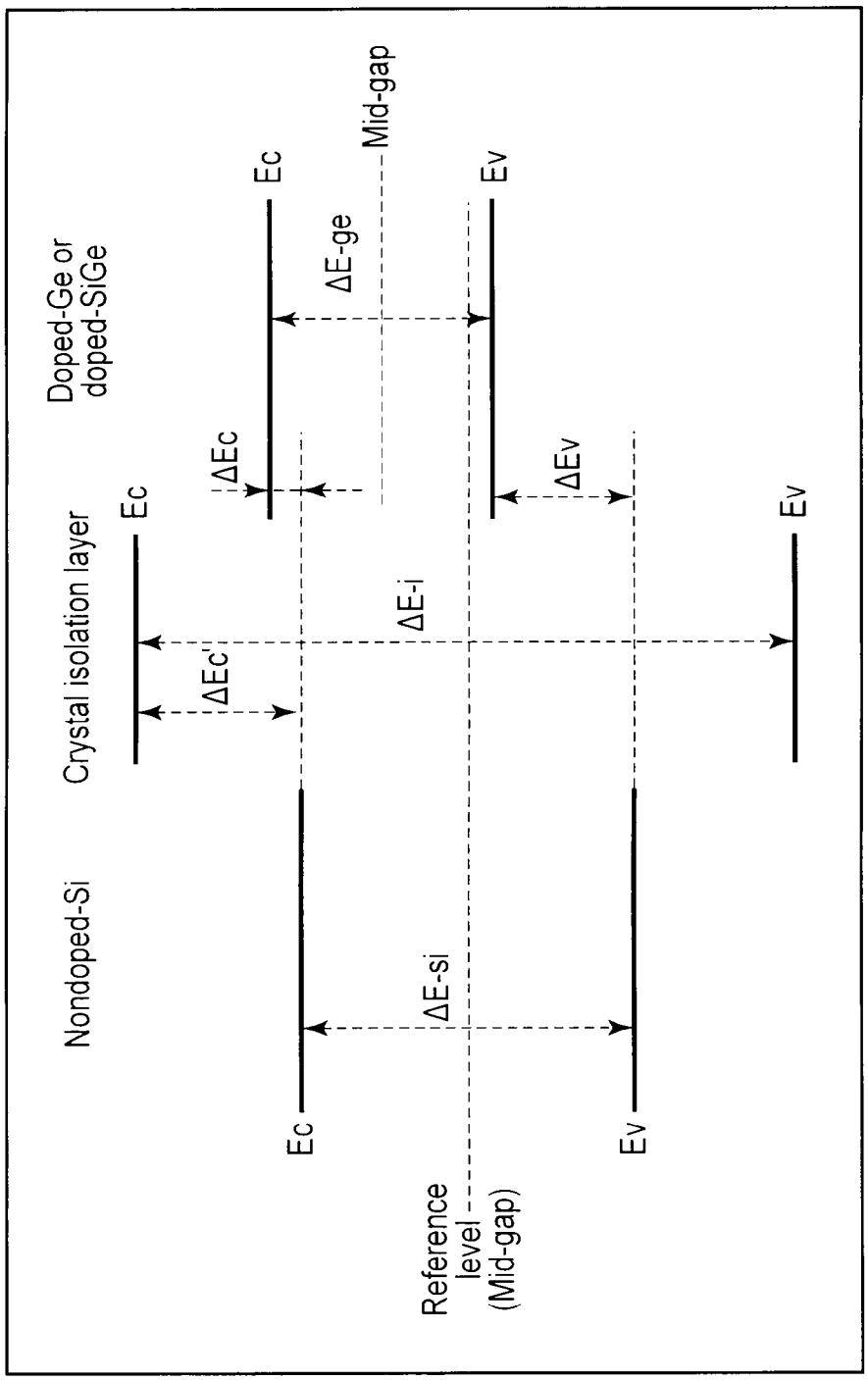
F I G. 10

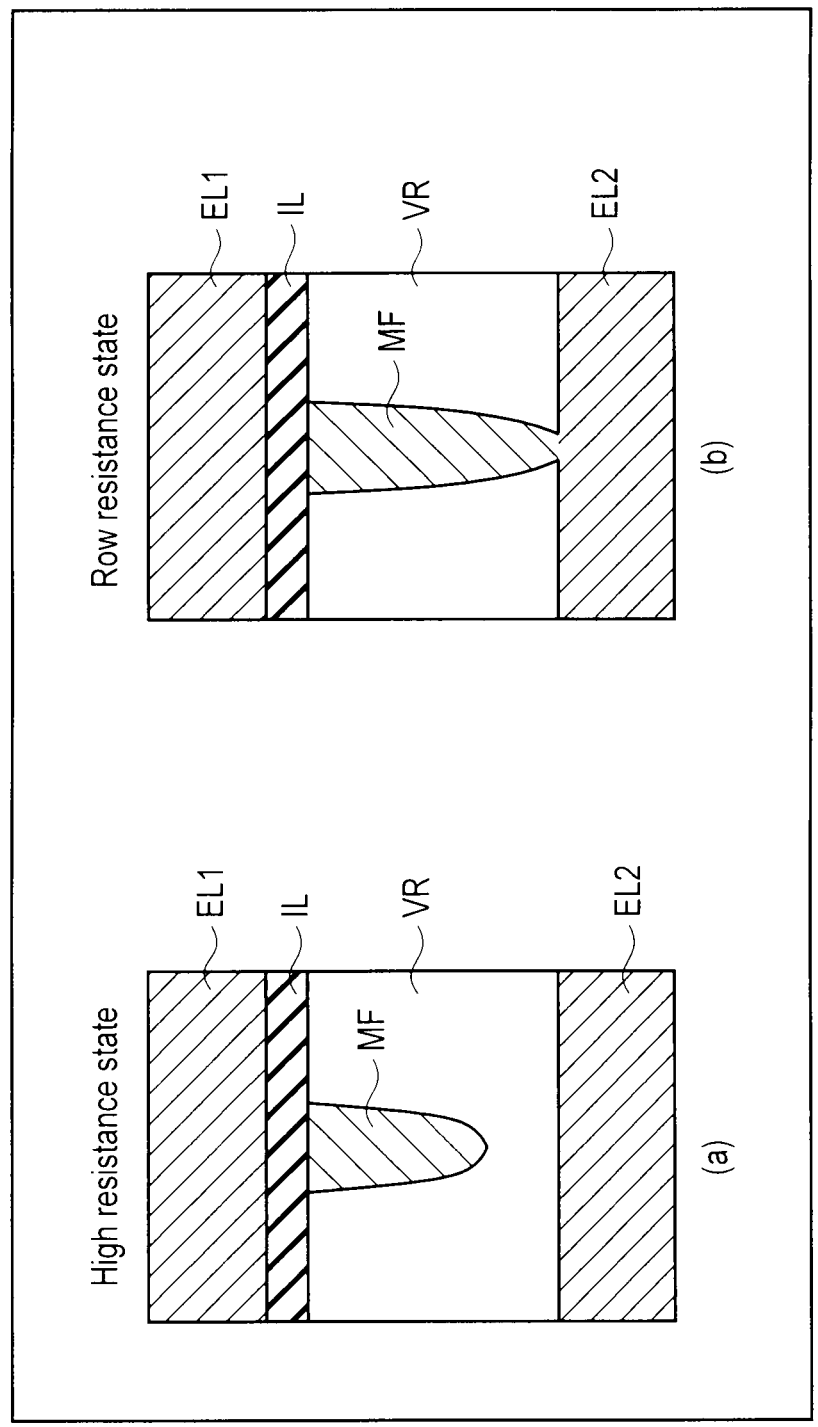
F I G. 11

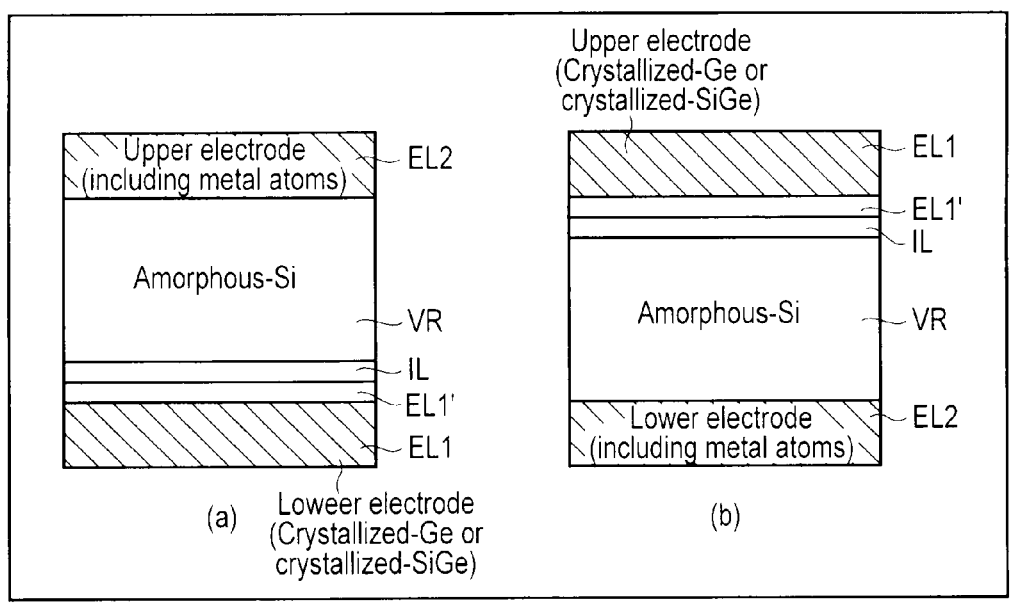
F I G. 12

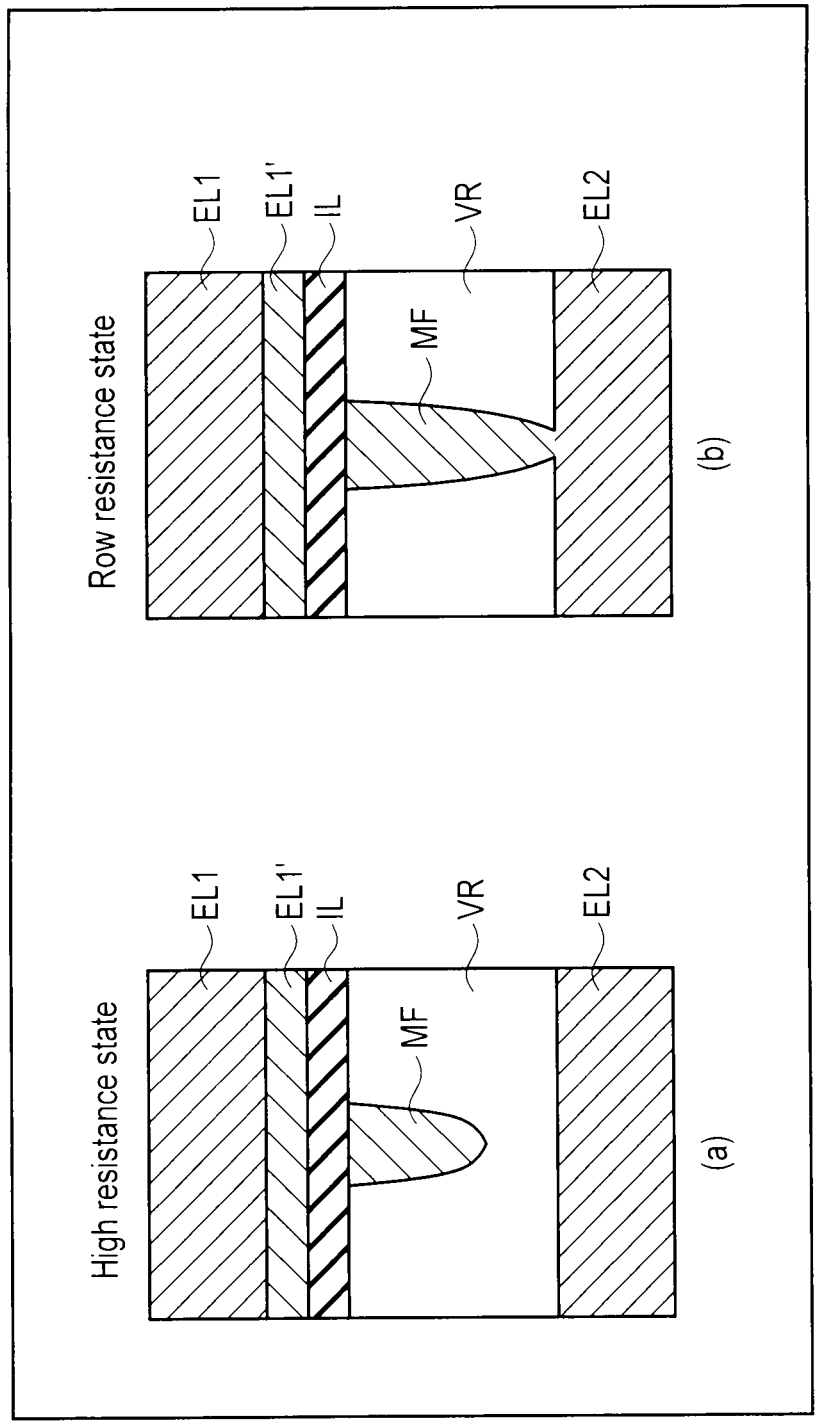
F I G. 13

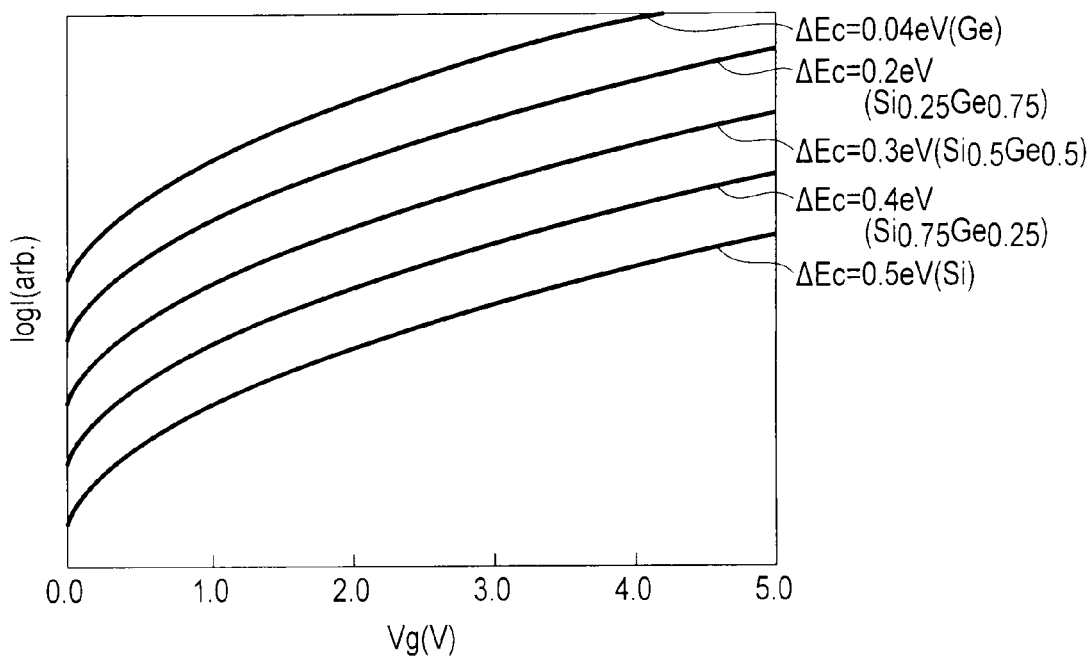
F I G. 14
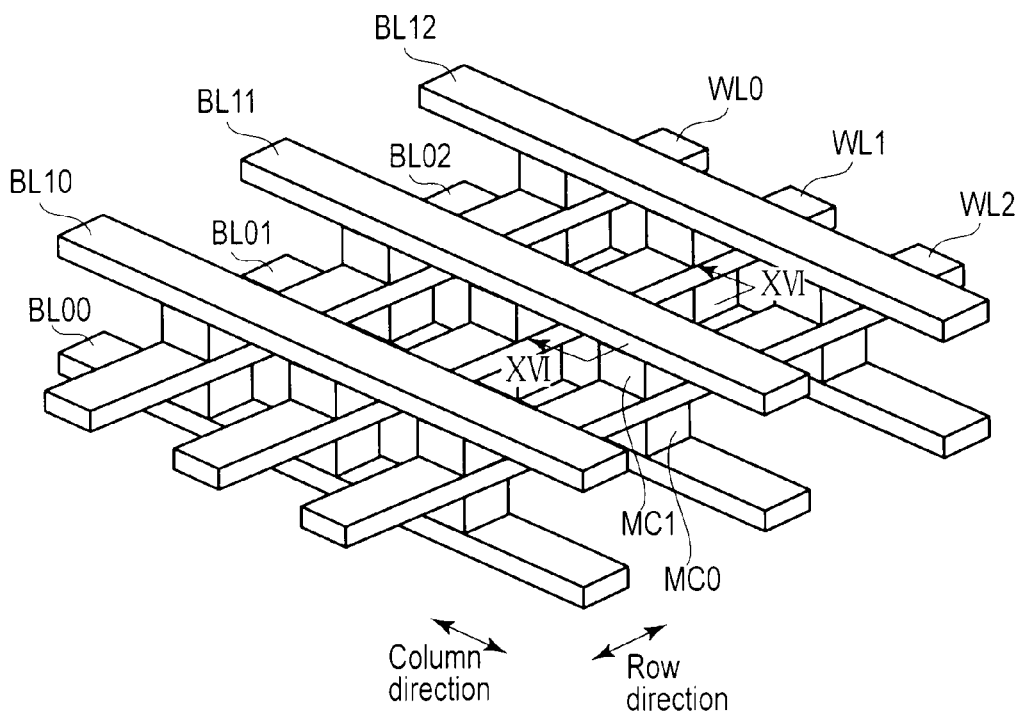
F I G. 15

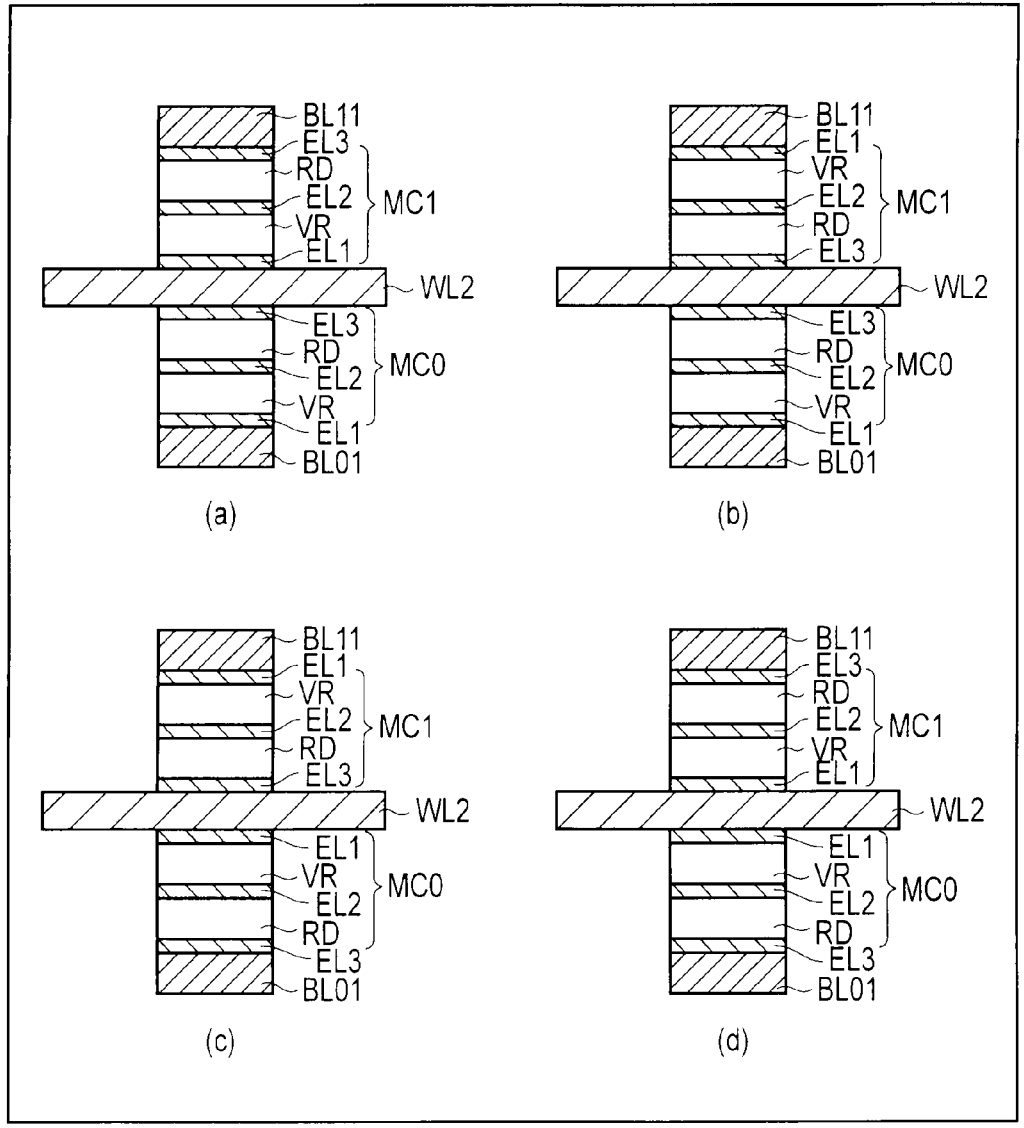
F I G. 16

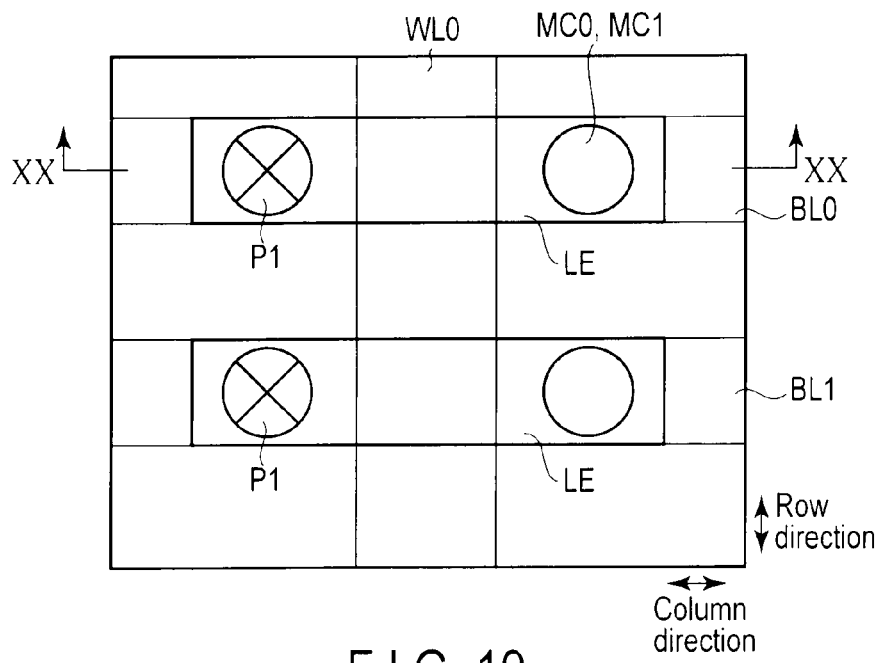
F I G. 19
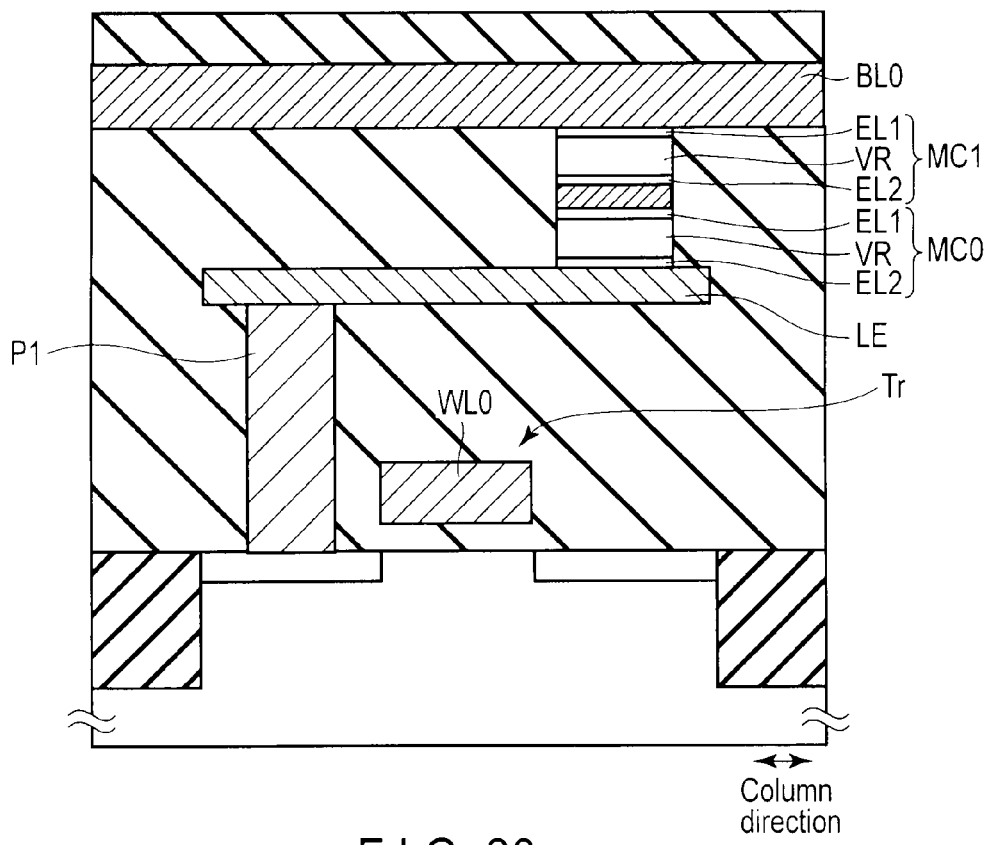
F I G. 20

VARIABLE RESISTANCE SEMICONDUCTOR MEMORY DEVICE

CROSS-REFERENCE TO RELATED APPLICATIONS

This application is based upon and claims the benefit of priority from prior Japanese Patent Application No. 2011-063353, filed Mar. 22, 2011, the entire contents of which are incorporated herein by reference.

FIELD

Embodiments described herein relate generally to a memory device.

BACKGROUND

As an electrically rewritable nonvolatile memory having a large capacity, a flash memory has heretofore been well known. The large capacity of the flash memory has been realized by microfabrication, but it is considered that it will be difficult to attain a larger capacity due to a limit of the microfabrication. Meanwhile, as a replacement for the flash memory, a resistive RAM using a variable resistance element has been proposed. It is possible to configure the resistive RAM by using a so-called crosspoint memory in which the variable resistance element is disposed at an intersection of a bit line and a word line. Therefore, the resistive RAM has the advantage of a larger capacity enabled by a three-dimensional structure which is attained due to easy layer structure formation.

As the types of the variable resistance elements, a phase change RAM (hereinafter referred to as PRAM), the resistive RAM (hereinafter referred to as ReRAM) using an oxide, an electrochemical metallization memory (hereinafter referred to as ECM), and the like have been known. Examples of the ECM include a memory (amorphous Si memory; hereinafter referred to as a-Si memory) using amorphous silicon and the like.

BRIEF DESCRIPTION OF THE DRAWINGS

FIG. 1 is a diagram showing a nonvolatile semiconductor memory device;

FIG. 4 is a diagram showing a comparative example of the memory cell;

FIG. 5 is a diagram showing a band of the memory cell of FIG. 4;

FIG. 6 is a diagram showing one embodiment of memory cell;

FIG. 7 is a diagram showing a band of the memory cell of FIG. 6;

FIG. 10 is a diagram showing a band of the memory cell of FIG. 9;

FIG. 11 is a diagram illustrating an operation of the memory cell of FIG. 9;

FIG. 12 is a diagram showing yet another embodiment of memory cell;

FIG. 13 is a diagram illustrating an operation of the memory cell of FIG. 12;

FIG. 14 is a diagram showing voltage-current characteristics of a variable resistance element according to the embodiment;

FIG. 15 is a diagram showing one example of application to a three-dimensional crosspoint memory;

FIG. 16 is a diagram showing one example of memory cell structure of FIG. 15;

FIG. 19 is a diagram showing one example of application to a three-dimensional 1-transistor n-element memory; and FIG. 20 is a sectional view taken along a line XX-XX of FIG. 19.

DETAILED DESCRIPTION

Figure 2:
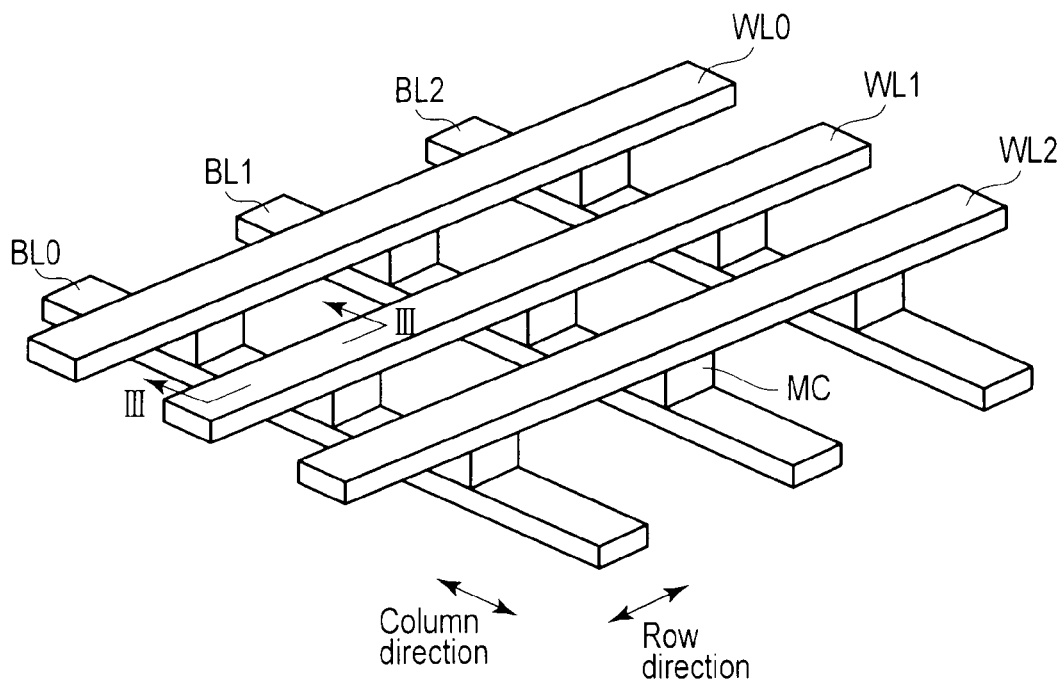
FIG. 2 is a diagram showing a memory cell array.

In general, according to one embodiment, a memory device comprising: a first electrode including a crystallized $Si_xGe_{1-x}$ layer ($0 \leq x < 1$); a second electrode including a metal element; a variable resistance part between the first and second electrode, the part including an amorphous Si layer; and a control circuit controlling a filament in the amorphous Si layer, the filament including the metal element.

The a-Si memory is a 2-terminal element memory in which amorphous silicon serving as a variable resistance part is held between a p-type silicon electrode and a metal electrode of Ag, Cu, or the like. In the a-Si memory, a conduction band offset is generated between the amorphous silicon and the p-type silicon electrode. As a result, when the p-type silicon electrode has a fixed potential, the p-type silicon electrode is depleted upon application of a positive voltage to the metal electrode of Ag or the like, whereby the voltage is distributed. In short, a high voltage for the voltage due to the depletion of the p-type silicon electrode is required when switching the a-Si memory.

Further, each of memory cells of the a-Si memory has a structure in which Si of two types of crystal phases, namely the amorphous silicon in the variable resistance part and single crystal silicon or polycrystalline silicon in the p-type silicon electrode, are layered. In this case, the amorphous silicon in the variable resistance part is crystallized when performing activation annealing on the p-type silicon electrode to cause a problem that characteristics of the memory cell are changed due to changes in volume and conductivity of the memory cell.

Hereinafter, embodiments will be described with reference to the accompanying drawings.

[Basic Configuration]

The embodiments are applied to a memory device (e.g. a nonvolatile semiconductor memory device such as a ReRAM, a next generation memory device in which a storage unit is accessed by an access function such as a probe, or the like) in which amorphous Si is used for a memory unit (variable resistance part).

In such memory device, the memory unit includes a first electrode including a crystallized $Si_xGe_{1-x}$ ($0 \leq x < 1$) layer, a second electrode including a metal element, and the variable resistance part disposed between the first and second electrodes and including an amorphous Si layer.

A write (set)/erase (reset) operation is performed by controlling a shape including a length, a thickness, and the like of a filament which is generated in the amorphous Si layer and formed of the metal element included in the second electrode using a voltage applied between the first and second electrodes.

Since the crystallized Si layer has heretofore been used for the first electrode as shown in FIGS. 4 and 5, a large set voltage is required for the set operation since a conduction band offset between the crystallized Si layer and the amorphous Si layer is large as a primary drawback. As a secondary drawback, characteristics of the amorphous Si layer are changed in some cases when the amorphous Si layer serving as the variable resistance part is undesirably crystallized by annealing which is performed for forming the crystallized Si layer.

In contrast, with the use of the $Si_xGe_{1-x}$ ($0 \leq x < 1$) layer which is doped with an impurity and crystallized for the first electrode as shown in FIGS. 6 and 7, it is possible to realize high speed writing owing to a reduction in set voltage which is attained by a reduction in conductivity band offset between the crystallized $Si_xGe_{1-x}$ layer and the amorphous Si as a primary improvement. As a secondary improvement, since an annealing temperature for forming the crystallized $Si_xGe_{1-x}$ layer is lower than a temperature (about 600° C.) for crystallizing the amorphous Si layer, it is possible to prevent crystallization of the amorphous Si and to suppress changes in characteristics.

Thus, it is possible to reduce an operation voltage of the memory device obtained by using the amorphous Si in the memory unit (variable resistance part) as well as to form the memory device by a low temperature process.

[Configuration Example of Memory Device]

FIG. 1 is a block diagram showing a nonvolatile semiconductor memory device.

Memory cell array 1 has a configuration of a crosspoint type, 1-transistor 1-variable resistance element type, or the like. In the crosspoint type, memory cells MC each of which is disposed between word line WL and bit line BL are provided. Memory cell MC includes a variable resistance element and a rectifying element serving as a selector. The variable resistance element and the rectifying element are serially connected. The rectifying element may be omitted when the variable resistance element has a rectifying function.

Column control circuit 2 is disposed at one end of memory cell array 1 in a direction of extension of bit line BL. Column control circuit 2 controls a voltage of bit line BL in data reading, writing, and erasing on memory cell MC.

Row control circuit 3 is disposed at the other end of memory cell array 1 in a direction of extension of word line WL. Row control circuit 3 controls a voltage of word line WL in data reading, writing, and erasing on memory cell MC.

Data input/output buffer 4 sends/receives data to/from an external host. The data include command data for reading, writing, and erasing, address data, read/write data, and the like. Data input/output buffer 4 transfers the write data to column control circuit 2 and outputs read data from column control circuit 2 to an external device.

The address data are temporarily stored in address resistor 5 via data input/output buffer 4. Further, the address data are transferred to column control circuit 2 and row control circuit 3. The command data are transferred to command interface 6 via data input/output buffer 4. Command interface 6 receives a control signal from the external host and determines the type of the data inputted to data input/output buffer 4 to transfer the data to state machine 7 when the data are determined to be the command data.

State machine 7 controls an operation of the entire nonvolatile semiconductor memory device, such as reading, writing, erasing, data input/output, and the like. The external host may receive status information controlled by state machine 7 to determine an operation result. The status information is used also for the control of the writing and erasing.

State machine 7 also controls pulse generator 8 which is a part of the control circuit. By the control, pulse generator 8 is enabled to output a pulse having an arbitrary voltage and at an arbitrary timing.

For example, since the address data are supplied to state machine 7 from address resistor 5, state machine 7 is capable of determining the selected memory cell which is an object of the reading/writing in memory cell array 1. Pulse generator 8 generates a voltage pulse for the selected memory cell. It is possible to transfer the generated voltage pulse to predetermined word line WL and bit line BL by column control circuit 2 and row control circuit 3.

Memory cell array 1 may have a three-dimensional structure without limitation to the configuration of the crosspoint type, 1-transistor-1-element type, and the like. In this case, it is possible to form peripheral circuits except for the memory cell array on a silicon substrate which is directly under memory cell array 1. Thus, it is possible to adjust a chip area of the nonvolatile semiconductor memory device to an area which is substantially the same as an area of memory cell array 1.

Figure 3:
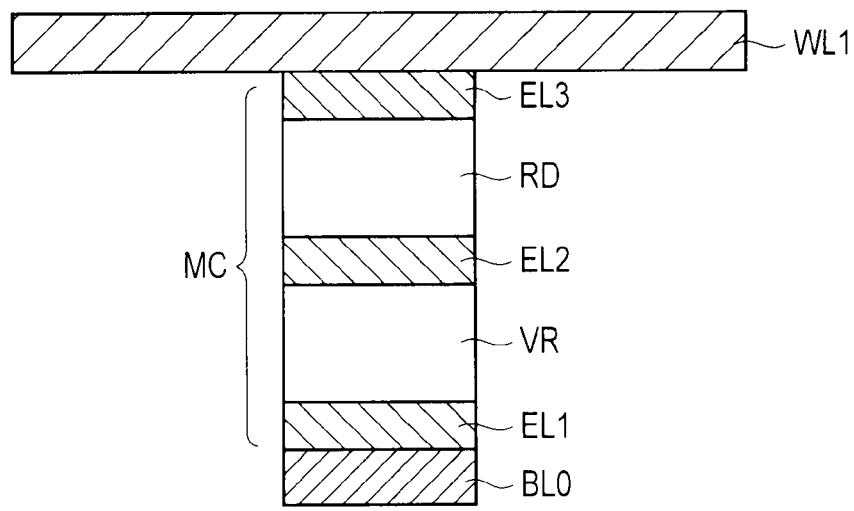
FIG. 3 is a sectional view taken along a line III-III of FIG. 2.

FIG. 2 shows one example of memory cell array 1. FIG. 3 shows a sectional view taken along a line III-III of FIG. 2.

Bit lines BL0 to BL2 extend in a column direction, and word lines WL0 to WL2 extend in a row direction. Each of memory cells MC is disposed at each of intersections of bit lines BL0 to BL2 and word lines WL0 to WL2. For bit line BL and word line WL, it is preferable to use a material having strong heat resistance and a low resistance value, and, for example, a metal material such as W, WSi, Mo, MoSi, NiSi, and CoSi, a carbon material such as a carbon nanotube and a graphene, or the like may be used.

Memory cell MC includes series-connected variable resistance element VR and rectifying element RD. Electrodes EL2 and EL1 functioning as a barrier metal and an adhesion layer are disposed above and below variable resistance element VR. Likewise, Electrodes EL3 and EL2 functioning as a barrier metal and an adhesion layer are disposed above and below rectifying element RD.

A positional relationship between rectifying element RD and variable resistance element VR may be inverted. Further, electrode EL2 may be formed of a layer structure of an electrode contacting rectifying element RD and an electrode contacting variable resistance element VR. Further, a layer structure of word line WL1/variable resistance element VR/bit line BL0 may be used.

For electrodes EL1, EL2, and EL3, Pt, Au, Ag, Cu, Zn, TiAlN, SrRUO, Ru, RuN, Ir, Co, Ti, TiN, TaN, LaNiO, Al, $PtIrO_x$, $PtRhO_x$, Rh, TaAlN, or the like may be used.

Each of electrodes EL1, EL2, and EL3 may include a metal film for uniform orientation or may include a buffer layer, a barrier metal layer, an adhesion layer, and the like.

Variable resistance element VR includes amorphous silicon, in which a resistance value can be changed by way of a current, heat, chemical energy, or the like caused by voltage application. As rectifying element RD, the element having a rectifying function, such as a MIM diode and PIN diode, may be used.

[Comparative Example]

FIG. 4 shows a comparative example of memory cell.

In FIG. 4A, variable resistance element VR is formed on electrode (lower electrode) EL1, and electrode (upper electrode) EL2 is formed on variable resistance element VR. In FIG. 4B, variable resistance element VR is formed on electrode (lower electrode) EL2, and electrode (upper electrode) EL1 is formed on variable resistance element VR.

Variable resistance element VR includes non-doped amorphous silicon as a main body and functions as a variable resistance member. Electrode EL1 has a crystallized silicon layer such as a polycrystalline silicon layer at least on a part contacting variable resistance element VR. Electrode EL2 has a metal layer such as an Ag layer at least on a part contacting variable resistance element VR.

FIG. 5 shows an energy band of the memory cell of FIG. 4.

A band gap ΔE-si between the maximum energy Ev of a valence band and the minimum energy Ec of a conduction band of the nondoped amorphous silicon (Si) is about 1.12 eV, and, also, a band gap ΔE-psi between the maximum energy Ev of a valence band and the minimum energy Ec of a conduction band of the polycrystalline silicon (Si) which is doped with an impurity (e.g. p-type impurity) is about 1.12 eV.

Further, since a valence band offset ΔEv between the non-doped amorphous silicon and the impurity-doped polycrystalline silicon is about 0.5 eV, a conduction band offset between the nondoped amorphous silicon and the impurity-doped polycrystalline silicon is about 0.5 eV.

Mid-gap means an intermediate value (intermediate value between band gap ΔE-si and ΔE-psi) between the maximum energy Ev of valance band and the minimum energy Ec of conduction band.

However, in the configuration of Comparative Example, the set voltage required for writing is large in the writing operation (set operation) in which variable resistance element VR is changed from a high resistance state to a low resistance state, which is disadvantageous and therefore is a problematic.

Further, in the configuration of FIG. 4B, it is necessary to form the crystallized silicon as upper electrode EL1 after formation of amorphous silicon as variable resistance element VR. In the configuration, a problem of a change in characteristics of the memory cell occurs due to a volume change and a conductivity change of variable resistance element VR, which are caused by the crystallization of amorphous silicon used as variable resistance element VR during the activation annealing on upper electrode EL1.

Further, in the configuration of FIG. 4A, when the structure of the memory cell array is of the crosspoint type and the memory cell array is three-dimensional, amorphous silicon as variable resistance element VR of a memory cell in a lower layer is crystallized during activation annealing on lower electrode EL1 of a memory cell in an upper layer, and a volume change and a conductivity change of the memory cell in the lower layer occurs, thereby raising a problem of a change in characteristics of the memory cell.

In the following embodiments, the above-explained problems are simultaneously solved.

[First Embodiment]

FIG. 6 shows the first embodiment of a memory cell.

In FIG. 6A, variable resistance element VR is formed on electrode (lower electrode) EL1, and electrode (upper electrode) EL2 is formed on variable resistance element VR. In FIG. 6B, variable resistance element VR is formed on electrode (lower electrode) EL2, and electrode (upper electrode) EL1 is formed on variable resistance element VR.

Variable resistance element VR has nondoped amorphous silicon as its main body and functions as a variable resistance member. Electrode EL1 has a crystallized germanium (Ge) layer or a crystallized silicon germanium (SiGe) layer at least on a portion contacting variable resistance element VR. Electrode EL2 has a conductive layer containing a metal atom at least on a portion contacting variable resistance element VR.

The conductive layer containing metal atom contains at least one atom selected from the group consisting of Ag, Fe, Co, Ni, Cu, Au, and Zn.

FIG. 7 shows an energy band of FIG. 6.

A band gap ΔE-si between the maximum energy Ev of a valence band and the minimum energy Ec of a conduction band of nondoped amorphous silicon (Si) is about 1.12 eV.

A band gap ΔE-ge between the maximum energy Ev of a valence band and the minimum energy Ec of a conduction band of Ge or SiGe ($Si_xGe_{1-x}$: 0≤x<1) which is doped with an impurity (e.g. p-type impurity) and crystallized is within a range of:

about 0.66 eV ($Si_xGe_{1-x}$: x=0)≤ΔE-ge< about 1.12 eV ($Si_xGe_{1-x}$: x=1).

Further, since a valence band offset ΔEv between the non-doped amorphous silicon and the impurity-doped and crystallized Ge or SiGe is about 0.5 eV, a conduction band offset ΔEc between the nondoped amorphous silicon and the impurity-doped and crystallized Ge or SiGe is within a range of:

about 0.04 eV≤ΔEc< about 0.5 eV.

Mid-gap means an intermediate value (intermediate value between band gap ΔE-si and ΔE-ge) between the maximum energy Ev of valance band and the minimum energy Ec of conduction band.

More specifically, since it is possible to reduce the conduction band offset ΔEc in the configuration of the first embodiment as compared to the conventional examples, it is possible to increase an electronic current in a write operation (set operation) in which variable resistance element VR is changed to a high resistance state to a low resistance state. Therefore, it is possible to realize high speed writing by reducing the set voltage required for writing.

The effect is shown in FIG. 14. In FIG. 14, changes in voltage Vg applied to variable resistance element (high resistance state) VR and current I flowing to variable resistance element VR are shown. According in FIG. 14, it is understood that current I when using Ge or SiGe for electrode EL1 is larger than current I when using Si for electrode EL1 if voltage Vg is fixed.

Further, since the valence band offset ΔEv is not different from that of the conventional examples, it is possible to secure a satisfactory voltage margin between a selected memory cell and a non-selected memory cell in an erase operation (reset operation) in which variable resistance element VR is changed from the low resistance state to the high resistance state.

Further, a temperature at which Ge and SiGe are crystallized is lower than that at which Si is crystallized. More specifically, since Ge and SiGe enable to perform the activation annealing at a temperature lower than that for Si, it is possible to avoid the crystallization of amorphous silicon used as variable resistance element VR in a nonvolatile semiconductor memory device production process. Therefore, it is possible to improve the characteristics of memory cells. This feature will be described under the column of production process.

[Set/Reset Operation]

Figure 8:
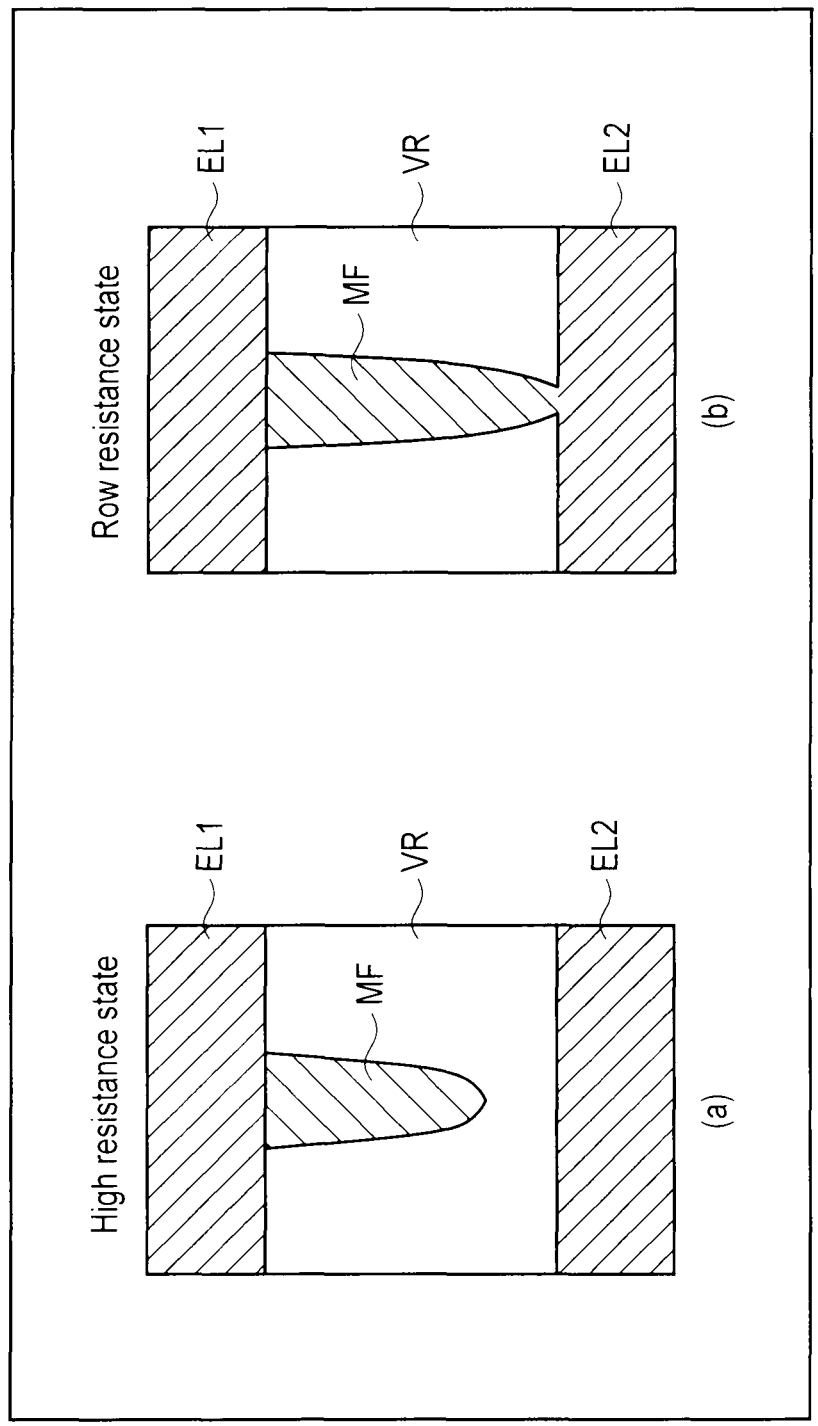
FIG. 8 is a diagram illustrating an operation of the memory cell of FIG. 6.

FIG. 8 is a diagram schematically showing one example of operation of memory cells.

Variable resistance element (nondoped amorphous Si) VR is in a reset state (high resistance state) as its initial state. Further, electrode EL1 is a polycrystalline Ge layer doped with the p-type impurity, and electrode EL2 is an Ag layer.

In a write operation (set operation), when a positive voltage and a fixed voltage (e.g. ground voltage) are applied to electrode EL2 and electrode EL1, the Ag atoms in electrode EL2 are ionized to be diffused into variable resistance element VR and then migrate to electrode EL1. The ionized Ag atoms after the migration to electrode EL1 receive electrons from electrode EL1 and are precipitated as a metal, thereby forming metal filament MF.

Since metal filament MF gradually extends from electrode EL1 toward electrode EL2, a resistance between electrodes EL1 and EL2 is reduced in inverse proportion to a shape including a length, a thickness, and the like of metal filament MF. Ultimately, since a leading end of metal filament MF contacts electrode EL2, for example, variable resistance element VR transits from the high resistance state to the low resistance state. Current between electrode EL1 and electrode EL2 in the low resistance state is higher than current between electrode EL1 and electrode EL2 in the high resistance state, when a positive voltage and a fixed voltage (e.g. ground voltage) are applied to electrode EL2 and electrode EL1. This is the set operation.

Since it is possible to maintain the conduction band offset ΔEc between the nondoped amorphous Si and the p-type impurity-doped polycrystalline Ge as shown in FIG. 14 as a result of using the polycrystalline Ge layer for electrode EL1, it is possible to contribute to the reduction in set voltage and the high speed operation.

On the other hand, an erase (reset) operation in which variable resistance element VR transits from the low resistance state to the high resistance state is performed by applying an electric field having reverse polarity to the main body of variable resistance element VR. In this operation, metal filament MF is gradually shortened to be cut off from electrode EL2. Thus, variable resistance element VR transits from the low resistance state to the high resistance state. Current between electrode EL1 and electrode EL2 in the high resistance state may be substantially the same as current between electrode EL1 and electrode EL2 in the low resistance state, when a fixed voltage (e.g. ground voltage) and a positive voltage are applied to electrode EL2 and electrode EL1.

[Production Process]

A memory cell production process according to the first embodiment will be described.

In this example, a production process of a variable resistance part of a memory cell will be described, and explanation for a rectifying element is omitted. Further, the memory cell has the configuration shown in FIG. 6A, and explanation for a wiring part is omitted since the wiring part can be formed by an ordinary BEOL (Back End Of Line) process.

To start with, an amorphous germanium (a-Ge) layer which is doped with boron (B) is formed as lower electrode EL1 by PE-CVD (Plasma Enhanced Chemical Vapor Deposition). A dope concentration of boron is $1 \times 10^{20}$ cm$^{-3}$, for example. After that, annealing for crystallization is performed to form a p-type polycrystalline Ge layer as lower electrode EL1. An annealing temperature is 300° C., for example.

Next, an amorphous silicon (Si) layer is formed as variable resistance element VR on lower electrode EL1 by PE-CVD. A deposition temperature is 300° C., for example.

In this example, a mixture gas of a diborane gas and a germane gas is used as a raw material gas when depositing boron-doped amorphous germanium, and a disilane gas is used as a raw material gas when depositing amorphous silicon. When it is desired to deposit amorphous silicon at a higher temperature, it is possible to use a silane gas in place of the disilane gas.

Though each of the amorphous germanium layer and the amorphous silicon layer is formed by PE-CVD in this example, it is possible to employ LP-CVD (Low Pressure Chemical Vapor Deposition) in place of PE-CVD. Alternatively, PVD (Physical Vapor Deposition) such as sputtering, electron beam deposition, and MBD (Molecular Beam Deposition) may be employed.

Next, an Ag layer is formed as upper electrode EL2 on variable resistance element VR by resistance heating vapor deposition. After forming a resist pattern on the Ag layer by PEP (Photo Engraving Process), lower electrode EL1, variable resistance element VR, and upper electrode EL2 are processed by RIE (Reactive Ion Etching) using the resist pattern as a mask.

By the above-described steps, the memory cell is completed.

In the production process of the present example, the activation annealing on Ge may be performed simultaneously with the activation annealing on other members including the Si layer.

[Effect of the First Embodiment]

In a memory cell having the electrode containing the metal atom for forming the electric conduction path (metal filament) in the amorphous Si layer at one end of the amorphous Si layer forming the main body of the variable resistance element, it is possible to reduce the set voltage by providing the electrode formed of the impurity-doped and crystallized Ge or SiGe at the other end of the amorphous Si layer.

Further, when using SiGe for the electrode, a concentration gradient may be provided in a composition of SiGe in such a manner that the highest Si concentration is attained at a portion closest to the amorphous Si used as the variable resistance element.

Further, the annealing temperature for forming the crystallized Ge or SiGe is the same as or less than the temperature for depositing the amorphous Si layer. More specifically, since it is possible to maintain the annealing temperature for forming the crystallized Ge or SiGe to the temperature lower than the temperature (600° C.) at which the amorphous Si layer is crystallized, it is possible to maintain the crystal state of the amorphous Si used as the variable resistance element. As a result, characteristics of the nonvolatile semiconductor memory are improved.

[Second Embodiment]

Figure 9:
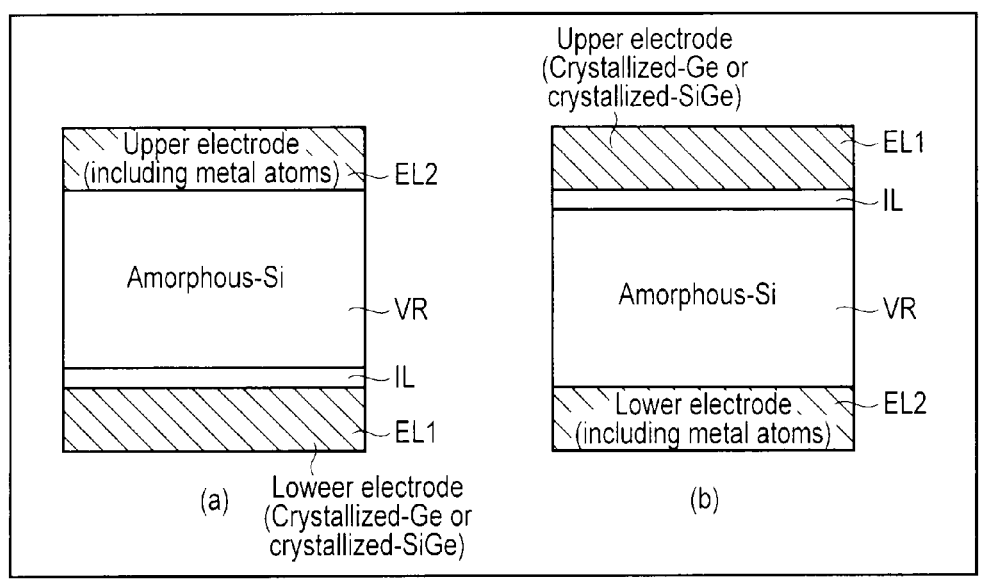
FIG. 9 is a diagram showing another embodiment of memory cell.

FIG. 9 shows the second embodiment of memory cells.

In FIG. 9A, inter layer IL is formed on electrode (lower electrode) EL1; variable resistance element VR is formed on inter layer IL; and electrode (upper electrode) EL2 is formed on variable resistance element VR. In FIG. 9B, variable resistance element VR is formed on electrode (lower electrode) EL2; inter layer IL is formed on variable resistance element VR; and electrode (upper electrode) EL1 is formed on inter layer IL.

Variable resistance element VR has nondoped amorphous silicon as its main body and functions as a variable resistance member. Electrode EL1 has a crystallized germanium (Ge) layer or a crystallized silicon germanium (SiGe) layer at least on a portion close to variable resistance element VR. Electrode EL2 has a conductive layer containing a metal atom at least on a portion contacting variable resistance element VR.

The conductive layer containing metal atom contains at least one atom selected from the group consisting of Ag, Fe, Co, Ni, Cu, Ag, Au, and Zn.

Inter layer IL is disposed between electrode EL and variable resistance element VR. Inter layer IL may have a function to separate electrode EL and variable resistance element VR. Inter layer IL may have a function of isolating a crystal structure of crystallized $Si_xGe_{1-x}$ (0≤x<1) forming electrode EL1 from a crystal structure of amorphous silicon forming variable resistance element VR.

For inter layer IL, an oxide, an oxynitride, or a nitride of Si or a metal is used, which is one specie selected from the group consisting of silicon oxide, silicon oxynitride, silicon nitride, aluminum oxide, hafnium oxide, zirconium oxide, titanium oxide, lanthanum oxide, praseodymium oxide, and dysprosium oxide or one specie selected from the group consisting of silicates, aluminates, or nitrogen-containing mixed membranes of these oxides or nitrides such as HfSiO, ZrSiO, TiSiO, LaSiO, PrSiO, DySiO, HfAlO, ZrAlO, TiAlo, LaAlO, PrAlO, DyAlO, LaAlSiO, PrAlSiO, DyAlSiO, HfSiON, ZrSiON, and TiSiON.

Inter layer IL may desirably be amorphous in order to easily isolate crystal and to block the metal layer diffused from electrode EL2.

Further, it is possible to suppress a voltage drop in inter layer IL by using a high dielectric material (so-called High-k material) as inter layer IL. Further, when using $SiO_2$ as the inter layer IL and SiGe as electrode EL1, $SiO_2$ may be formed by oxidizing SiGe.

Further, in order to earn a current amount to be flowed to variable resistance element VR, it is desirable to decide a thickness of inter layer IL under the conditions where a tunneling current is directly generated. The thickness of inter layer IL which is desirable for directly supplying the tunneling current is 3 nm or less. Further, in order to prevent crystal information of electrode EL1 from being inherited to variable resistance element VR, the thickness of inter layer IL may desirably be 0.3 nm or more corresponding to one atom layer.

Therefore, the desirable thickness of inter layer IL is within a range of from 0.3 nm to 3 nm.

FIG. 10 shows an energy band of the memory cells of FIG. 9.

A band gap $\Delta E$-si between the maximum energy Ev of a valence band and the minimum energy Ec of a conduction band of nondoped amorphous silicon (Si) is about 1.12 eV.

A band gap $\Delta E$-ge between the maximum energy Ev of a valence band and the minimum energy Ec of a conduction band of Ge or SiGe ($Si_xGe_{1-x}$: $0 \leq x < 1$) which is doped with an impurity (e.g. p-type impurity) and crystallized is within a range of:

about 0.66 eV ($Si_xGe_{1-x}$: x=0)$\leq \Delta E$-ge< about 1.12 eV ($Si_xGe_{1-x}$: x=1).

Further, since a valence band offset $\Delta Ev$ between the nondoped amorphous silicon and the impurity-doped and crystallized Ge or SiGe is about 0.5 eV, a conduction band offset $\Delta Ec$ between the nondoped amorphous silicon and the impurity-doped and crystallized Ge or SiGe is within a range of:

about 0.04 eV$\leq \Delta Ec<$ about 0.5 eV.

Mid-gap means an intermediate value (intermediate value between band gap $\Delta E$-si and $\Delta E$-ge) between the maximum energy Ev of the valance band and the minimum energy Ec of the conduction band.

As to the band gap $\Delta E$-i of the inter layer, $\Delta E$-i is about 8.9 eV when the crystal layer is $SiO_2$, for example, $\Delta E$-i is about 4.8 eV when the crystal layer is SiN, and $\Delta E$-i is about 6.5 eV when the crystal layer is LaO, for example.

Further, as to the conduction band offset $\Delta Ec'$ between the nondoped amorphous silicon and the inter layer, $\Delta Ec'$ is about 3.2 eV when the crystal layer is $SiO_2$, $\Delta Ec'$ is about 2.0 eV when the crystal layer is SiN, and $\Delta Ec'$ is about 3.1 eV when the crystal layer is LaO, for example.

More specifically, since it is possible to reduce the conduction band offset $\Delta Ec$ in the configuration of the second embodiment, too, as compared to the conventional examples, it is possible to increase an electronic current in a write operation (set operation) in which variable resistance element VR is changed from a high resistance state to a low resistance state. Therefore, it is possible to realize high speed writing by reducing the set voltage required for writing.

There is a risk that the inter layer reduces the current amount to be supplied to the variable resistance element, but it is possible to secure the current amount which is the same as that of the conventional examples by reducing the conduction band offset $\Delta Ec$. The larger the tunneling current which is allowed to pass through the inter layer IL, the more prominent is the effect. Further, since it is possible to increase the amount of the current (Ion) for the set operation, it is possible to increase a ratio to the current (Ioff) for the reset operation, thereby realizing expansion of a memory window.

Further, since the valence band offset $\Delta Ev$ is not different from that of the conventional examples, it is possible to secure a satisfactory voltage margin between the selected memory cell and the non-selected memory cell in the erase operation (reset operation) in which variable resistance element VR is changed from the low resistance state to the high resistance state.

Further, the temperature at which Ge and SiGe are crystallized is lower than the temperature at which Si is crystallized. In other words, since it is possible to perform the activation annealing on Ge and SiGe at the lower temperature as compared to the temperature for Si, it is possible to avoid the crystallization of amorphous silicon used as variable resistance element VR in the nonvolatile semiconductor memory device production process.

[Set/Reset Operation]

FIG. 11 is a diagram schematically showing one example of operation of a memory cell.

Variable resistance element (nondoped amorphous Si) VR is in a reset state (high resistance state) as its initial state. Further, electrode EL1 is a polycrystalline $Si_{0.5}Ge_{0.5}$ layer doped with the p-type impurity; electrode EL2 is a Co layer; and inter layer IL is a silicon oxide film.

In a write operation (set operation), when a positive voltage and a fixed voltage (e.g. ground voltage) are applied to electrode EL2 and electrode EL1, the Co atoms in electrode EL2 are ionized to be diffused into variable resistance element VR and then migrate to electrode EL1. The ionized Co atoms after the migration to electrode EL1 receive electrons from electrode EL1 via the tunneling current of inter layer IL and are precipitated as a metal, thereby forming metal filament MF.

Since metal filament MF gradually extends from electrode EL1 toward electrode EL2, a resistance between electrodes EL1 and EL2 is reduced in inverse proportion to a shape including a length, a thickness, and the like of metal filament MF. Ultimately, since a leading end of metal filament MF contacts electrode EL2, for example, variable resistance element VR transits from the high resistance state to the low resistance state. This is the set operation.

Since it is possible to maintain the conduction band offset $\Delta Ec$ between the nondoped amorphous Si and the p-type impurity-doped polycrystalline Ge to about 0.3 eV as shown in FIG. 14 as a result of the use of the polycrystalline $Si_{0.5}Ge_{0.5}$ layer for electrode EL1, it is possible to contribute to the reduction in set voltage and the high speed operation.

Further, though a deep level is formed in the polycrystalline SiGe layer used as electrode EL1 when the ionized Co atoms are diffused into variable resistance element VR to reach electrode EL1, inter layer IL prevents the Co atoms from diffusing into electrode EL1 to facilitate the current amount control.

On the other hand, an erase (reset) operation in which variable resistance element VR transits from the low resistance state to the high resistance state is performed by applying an electric field having reverse polarity to the main body of variable resistance element VR. In this operation, metal filament MF is gradually shortened to be cut off from electrode EL2. Thus, variable resistance element VR transits from the low resistance state to the high resistance state.

[Production Process]

A memory cell production process according to the second embodiment will be described.

In this example, a production process of a variable resistance part of a memory cell will be described, and explanation for a rectifying element is omitted. Further, the memory cell has the configuration shown in FIG. 6A, and explanation for a wiring part is omitted since wiring part can be formed by the ordinary BEOL process.

To start with, an amorphous silicon germanium (a-SiGe) layer which is doped with boron (B) is formed as lower electrode EL1 by PE-CVD. A dope concentration of boron is $1 \times 10^{20}$ cm$^{-3}$, for example. Subsequently, a SiO$_2$ layer is formed as inter layer on lower electrode EL1 by ALD (Atomic Layer Deposition). After that, annealing for crystallization is performed to form a p-type polycrystalline SiGe layer as lower electrode EL1. An annealing temperature is 500° C., for example.

Next, an amorphous silicon (Si) layer is formed as variable resistance element VR on lower electrode EL1 by LP-CVD. A deposition temperature is 520° C., for example.

In this example, a mixture gas of a diborane gas and a germane gas is used as a raw material gas when depositing boron-doped amorphous silicon germanium, and a disilane gas is used as a raw material gas when depositing amorphous silicon. When it is desired to deposit amorphous silicon at a higher temperature, it is possible to use a silane gas in place of the disilane gas.

Each of the amorphous silicon germanium layer and the amorphous silicon layer may be formed by one of PVD methods, such as PE-CVD, LP-CVD, sputtering, electron beam deposition, and MBD.

Next, a Co layer is formed as upper electrode EL2 on variable resistance element VR by electron beam vapor deposition. After forming a resist pattern on the Co layer by PEP, lower electrode EL1, inter layer IL, variable resistance element VR, and upper electrode EL2 are processed by RIE using the resist pattern as a mask.

By the above-described steps, the memory cell is completed.

In the production process of the present example, the activation annealing on SiGe may be performed simultaneously with the activation annealing on other members including the Si layer.

[Effect of the Second Embodiment]

In the second embodiment, the following effects are attained in addition to the effects described in the first embodiment.

Since inter layer IL enables to prevent crystal information of electrode EL1 from being inherited to variable resistance element VR, it is possible to attain a more stable crystal state of the amorphous Si layer used as the variable resistance element.

[Third Embodiment]

FIG. 12 shows the third embodiment of a memory cell.

In FIG. 12A, inter layer IL is formed on electrodes (lower electrodes) EL1, EL1'; variable resistance element VR is formed on inter layer IL; and electrode (upper electrode) EL2 is formed on variable resistance element VR. In FIG. 12B, variable resistance element VR is formed on electrode (lower electrode) EL2; inter layer IL is formed on variable resistance element VR; and electrodes (upper electrodes) EL1, EL1' are formed on inter layer IL.

Variable resistance element VR has nondoped amorphous silicon as its main body and functions as a variable resistance member. Electrode EL1 has a crystallized germanium (Ge) layer or a crystallized silicon germanium (SiGe) layer at least on a portion contacting variable resistance element VR. Electrode EL1' has a crystallized silicon (Si) layer.

Electrode EL2 has a conductive layer containing a metal atom at least on a portion contacting variable resistance element VR. The conductive layer containing metal atom contains at least one atom selected from the group consisting of Ag, Fe, Co, Ni, Cu, Ag, Au, and Zn.

Inter layer IL is disposed between electrode EL1' and variable resistance element VR.

Since inter layer IL is the same as that of the second embodiment, the description thereof is not repeated.

The third embodiment is characterized by the feature of providing electrode EL1' between electrode EL1 and inter layer IL as compared to the second embodiment. For example, as a result of the use of crystallized Ge or SiGe for electrode EL1 and crystallized Si for electrode EL1', Si contacts both of surfaces of inter layer IL to improve uniformity of the surfaces in the metal ion moving region, thereby enabling to reduce a fluctuation in element. When inter layer IL is not used, it is also possible to reduce the constituent element in the metal ion moving region, thereby enabling to reduce element fluctuation.

For example, as a result of shaping a potential barrier of the conduction band to be in the form of steps or a slope using electrodes EL1 an EL1', a tunneling current is increased, and, therefore, it is possible to supply a larger current amount (Ion) than the conventional examples to variable resistance element VR in the set operation. Therefore, it is possible to increase a ratio to the current (Ioff) for the reset operation, thereby realizing expansion of a memory window. In order to secure the tunneling current, a thickness of electrode EL1' may preferably be 3 nm or less.

Further, since the valence band offset is not different from that of the conventional examples, it is possible to secure a satisfactory voltage margin between the selected memory cell and the non-selected memory cell in the erase operation (reset operation) in which variable resistance element VR is changed from the low resistance state to the high resistance state.

Further, the temperature at which Ge and SiGe are crystallized is lower than the temperature at which Si is crystallized. In other words, since it is possible to perform the activation annealing on Ge and SiGe at the lower temperature as compared to Si, it is possible to avoid the crystallization of amorphous silicon used as variable resistance element VR in the nonvolatile semiconductor memory device production process. Therefore, it is possible to improve characteristics of the memory cell.

[Set/Reset Operation]

FIG. 13 is a diagram schematically showing one example of operation of a memory cell.

Variable resistance element (nondoped amorphous Si) VR is in a reset state (high resistance state) as its initial state. Further, electrode EL1 is a polycrystalline Ge layer doped with a p-type impurity; electrode EL1' is a polycrystalline Si layer doped with a p-type impurity; electrode EL2 is a Cu layer; and inter layer IL is SiN.

In a write operation (set operation), when a positive voltage and a fixed voltage (e.g. ground voltage) are applied to electrode EL2 and electrodes EL1, EL1', the Cu atoms in electrode EL2 are ionized to be diffused into variable resistance element VR and then migrate to electrodes EL1, EL1'. The ionized Cu atoms after the migration to electrodes EL1, EL1' receive electrons from electrodes EL1, EL1' and are precipitated as a metal, thereby forming metal filament MF.

Since metal filament MF gradually extends from electrodes EL1, EL1' toward electrode EL2, a resistance between electrodes EL1, EL1' and EL2 is reduced in inverse proportion to a shape including a length, a thickness, and the like of metal filament MF. Ultimately, since a leading end of metal filament MF contacts electrode EL2, for example, variable resistance element VR transits from the high resistance state to the low resistance state. This is the set operation.

Since it is possible to maintain the conduction band offset $\Delta Ec$ between the nondoped amorphous Si and the p-type impurity-doped polycrystalline Ge to about 0.04 eV as shown in FIG. 14 as a result of the use of the polycrystalline Ge layer for electrode EL1, it is possible to contribute to the reduction in set voltage and the high speed operation.

Further, though a deep level is formed in the semiconductor layer (polycrystalline SiGe/polycrystalline Si) used as electrodes EL1, EL1' when the ionized Cu atoms are diffused into variable resistance element VR, inter layer IL prevents the Cu atoms from diffusing into electrodes EL1, EL1' to facilitate the current amount control.

Further, control of the shape of the potential barrier of the conduction band is facilitated by the layer structure of electrodes EL1, EL1'. Therefore, the control of the current amount and the voltage amount in the set operation is facilitated.

On the other hand, an erase (reset) operation in which variable resistance element VR transits from the low resistance state to the high resistance state is performed by applying an electric field having reverse polarity to the main body of variable resistance element VR. In this operation, metal filament MF is gradually shortened to be cut off from electrode EL2. Thus, variable resistance element VR transits from the low resistance state to the high resistance state.

In the third embodiment, variable resistance element VR may contain in amorphous silicon low resistance particles having a lower resistance than the amorphous silicon in the same manner as in the second embodiment. In this case, it is possible to realize a multivalued memory, i.e. variable resistance element VR which stores three or more values by controlling the length of metal filament MF.

[Production Process]

A memory cell production process according to the third embodiment will be described.

In this example, a production process of a variable resistance part of a memory cell will be described, and explanation for a rectifying element is omitted. Further, the memory cell has the configuration shown in FIG. 6A, and explanation for a wiring part is omitted since wiring part can be formed by the ordinary BEOL process.

To start with, an amorphous germanium (a-Ge) layer which is doped with boron (B) is formed as lower electrode EL1 by PE-CVD. A dope concentration of boron is $1 \times 10^{20}$ cm$^{-3}$, for example. Subsequently, an amorphous silicon (a-Si) layer which is doped with boron (B) is formed as electrode EL1' on electrode EL1 by PE-CVD. A dope concentration of boron is $1 \times 10^{20}$ cm$^{-3}$, for example.

After that, annealing for crystallization is performed to form a p-type polycrystalline SiGe layer as electrode EL1 and a p-type polycrystalline Si layer as electrode EL1'. An annealing temperature is 500° C., for example.

As described above, the temperature at which amorphous silicon is crystallized is about 600° C., but annealing at the temperature equal to or higher than 600° C. causes the problem that the variable resistance element (amorphous silicon) in a memory cell in a lower layer is crystallized when the memory cell array has the three-dimensional structure.

Therefore, the annealing temperature in the third embodiment is less than 600° C. at which the amorphous silicon is ordinarily crystallized, i.e. is 500° C. It is possible to crystallize the amorphous silicon used as electrode EL1' into the polycrystalline silicon by the annealing temperature of 500° C. since it is possible to crystallize electrode (Si) EL1' by using electrode (Ge) EL1 as a crystal core. In short, the amorphous silicon used as electrode EL1' is satisfactorily crystallized at the annealing temperature of 500° C. Further, the impurity is activated by the crystallization annealing.

Next, a SiN layer of about 1 nm is formed as inter layer IL on electrode EL1' by ALD. Subsequently, an amorphous silicon (Si) layer is formed as variable resistance element VR on inter layer IL by LP-CVD. A deposition temperature is 520° C., for example.

In this example, a mixture gas of a diborane gas and a germane gas is used as a raw material gas when depositing boron-doped amorphous Ge, and a mixture gas of a diborane gas and a disilane gas is used as a raw material gas when depositing boron-doped amorphous Si. When it is desired to deposit amorphous Si at a higher temperature, it is possible to use a silane gas in place of the disilane gas.

Further, dichlorosilane and ammonium are used as raw material gases when depositing SiN, and a disilane gas is used as a raw material gas when depositing amorphous Si used as variable resistance element VR. When it is desired to deposit amorphous Si at a higher temperature, it is possible to use a silane gas in place of the disilane gas.

Each of the amorphous silicon germanium layer and the amorphous silicon layer may be formed by one of PVD methods, such as PE-CVD, LP-CVD, sputtering, electron beam deposition, and MBD.

Next, a Cu layer is formed as upper electrode EL2 on variable resistance element VR by sputtering. After forming a resist pattern on the Cu layer by PEP, lower electrodes EL1, EL1', inter layer IL, variable resistance element VR, and upper electrode EL2 are processed by RIE using the resist pattern as a mask.

By the above-described steps, the memory cell is completed.

Though the activation annealing processings on Ge and Si used for electrodes EL1, EL1' are performed simultaneously in the production process of the present example, they may be performed separately. Further, the activation annealing processings may be performed simultaneously with the activation annealing on other members including the Si layer.

[Effect of the Third Embodiment]

In the third embodiment, the following effects are attained in addition to the effects described in the first embodiment.

Since the crystallized Si layer is formed between the crystallized Ge or SiGe and inter layer IL, Si contacts both of the surfaces of inter layer IL to improve uniformity of the surfaces in the metal ion moving region, thereby reducing a fluctuation in element. Further, the crystallized Si layer inherits the crystal state of the crystallized Ge or SiGe, it is possible to crystallize the Si layer at the temperature lower than the temperature (about 600° C.) at which silicon is crystallized.

The control of the shape of the potential barrier may be performed in combination with the provision of the concentration gradient to the SiGe composition when using SiGe for the electrode. In this case, in the concentration gradient of the SiGe composition, the concentration at a portion closest to amorphous Si used as the variable resistance element has the highest Si concentration.

In the third embodiment, inter layer IL may be omitted. However, when inter layer IL is omitted, the effects described in the second embodiment are not observed.

[Application Example]

An application example will be described below.

FIG. 15 shows a perspective view of a case of applying the memory cells of the embodiments to crosspoint re-RAMs. FIGS. 16A to 16D show examples of memory cell structures and correspond to a sectional view taken along a line XVI-XVI of FIG. 15.

Bit lines BL00 to BL02 and BL10 to BL12 extend in a column direction, and word lines WL0 to WL2 extend in a row direction. Bit lines BL10 to BL12 are formed above bit lines BL00 to BL02. Each of memory cells MC0, MC1 is disposed at each of intersections of bit lines BL0 to B12 and BL10 to BL12 and word lines WL0 to WL2.

Each of memory cells MC0, MC1 includes variable resistance element VR and rectifying element RD. Electrodes EL2 and EL1 are disposed above and below variable resistance element VR. Likewise, Electrodes EL3 and EL2 are disposed above and below rectifying element RD.

In FIG. 16A, in each of memory cell MC0 between bit line BL01 and word line WL2 and memory MC1 between word line WL2 and bit line BL11, electrode EL1, variable resistance element VR, electrode EL2, rectifying element RD, and electrode EL3 are formed in this order from the bottom to the top.

In FIG. 16B, each of memory cell MC0 between bit line BL01 and word line WL2 and memory MC1 between word line WL2 and bit line BL11 is disposed symmetrically to word line WL2.

More specifically, electrode EL1, variable resistance element VR, electrode EL2, rectifying element RD, and electrode EL3 are formed in this order from the bottom to the top in memory cell MC0 between bit line BL01 and word line WL2. Further, electrode EL3, rectifying element RD, electrode EL2, variable resistance element VR, and electrode EL1 are formed in this order from the bottom to the top in memory cell MC1 between word line WL2 and bit line BL11.

In FIG. 16C, in each of memory cell MC0 between bit line BL01 and word line WL2 and memory MC1 between word line WL2 and bit line BL11, electrode EL3, rectifying element RD, electrode EL2, variable resistance element VR, and electrode EL1 are formed in this order from the bottom to the top.

In FIG. 16D, each of memory cell MC0 between bit line BL01 and word line WL2 and memory MC1 between word line WL2 and bit line BL11 is disposed symmetrically to word line WL2.

More specifically, electrode EL3, rectifying element RD, electrode EL2, variable resistance element VR, and electrode EL1 are formed in this order from the bottom to the top in memory cell MC0 between bit line BL01 and word line WL2. Further, electrode EL1, variable resistance element VR, electrode EL2, rectifying element RD, and electrode EL3 are formed in this order from the bottom to the top in memory cell MC0 between word line WL2 and bit line BL11.

Figure 17:
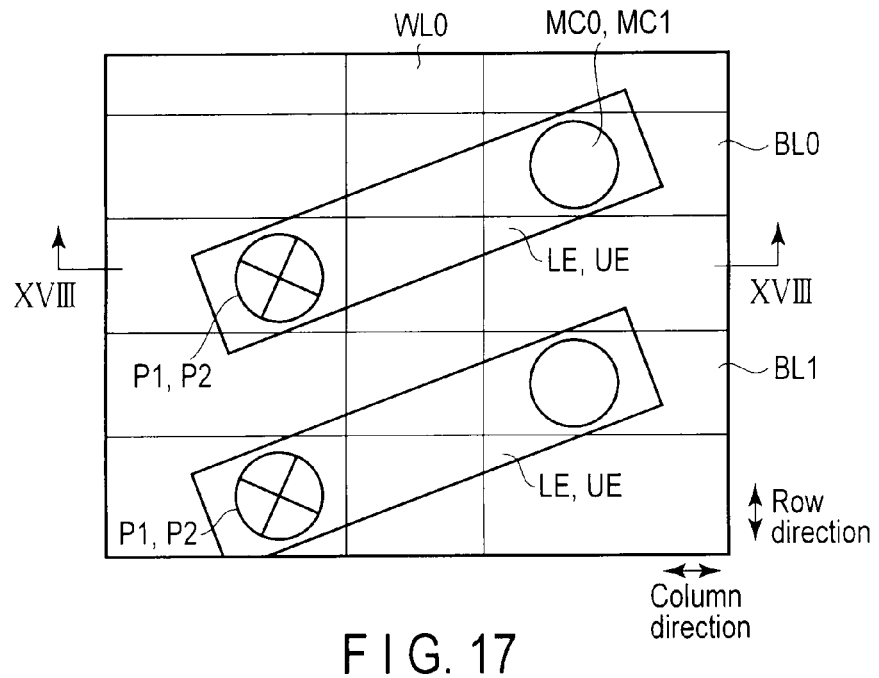
FIG. 17 is a diagram showing one example of application to a three-dimensional 1-transistor n-element memory.
Figure 18:
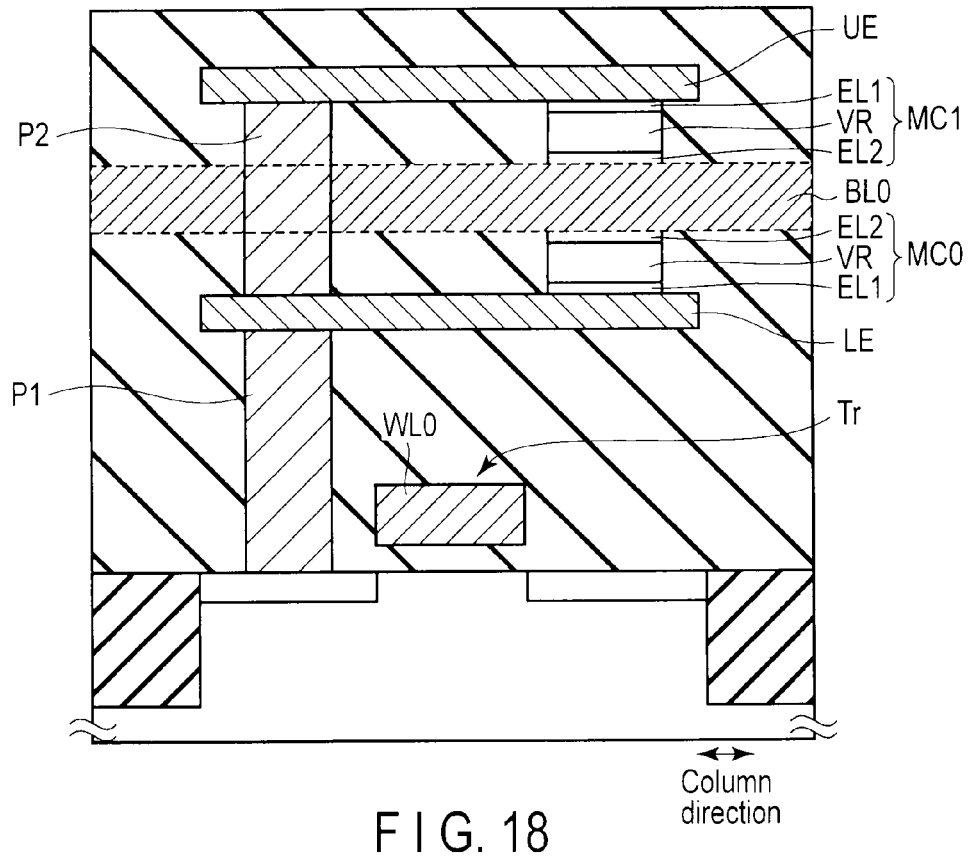
FIG. 18 is a sectional view taken along a line XVIII-XVIII of FIG. 17.

FIG. 17 and FIG. 19 show perspective views in which the memory cells of the embodiments are applied to 1-transistor 2-variable resistance element type nonvolatile memory. FIG. 18 is a sectional view taken along a line XVIII-XVIII of FIG. 17, and FIG. 20 is a sectional view taken along a line XX-XX of FIG. 17.

Bit lines BL0, BL1 extend in a column direction, and word line WL0 extend in a row direction. Bit lines BL0, BL1 are disposed parallel to each other in the row direction. Memory cells MC0, MC1 are disposed between bit line BL0 and lower electrode LE and upper electrode UE.

Lower electrode LE or upper electrode UE is connected to one end of a source/drain of a FET (Field Effect Transistor) serving as a selector via contact plugs P1, P2.

In this example, each of memory cells MC0, MC1 includes electrode EL1, variable resistance element VR, and electrode EL2.

In FIG. 17 and FIG. 18, memory cell MC0 between lower electrode LE and bit line BL0 and memory cell MC1 between bit line BL0 and upper electrode UE are disposed symmetrically to bit line BL0.

In other words, electrode EL2, variable resistance element VR, and electrode EL1 are formed in this order from the bottom to the top in memory cell MC0 between lower electrode LE and bit line BL0. Further, electrode EL1, variable resistance element VR, and electrode EL2 are formed in this order from the bottom to the top in memory cell MC1 between bit line BL0 and upper electrode UE.

In each of memory cells MC0, MC1 between lower electrode LE and bit line BL0 in FIGS. 19 and 20, electrode EL2, variable resistance element VR, and electrode EL1 are formed in this order from the bottom to the top.

CONCLUSION

According to the embodiments, it is possible to reduce an operation voltage of a memory device in which amorphous silicon is used for a memory unit as well as to form the memory device by a low temperature process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a first electrode of a resistance change element which comprises a crystallized $Si_xGe_{1-x}$ layer ($0 \leq x < 1$);
   a second electrode of a resistance change element which comprises a metal element;
   a variable resistance part between the first and second electrode, the part comprising an amorphous Si layer;
   a control circuit controlling a filament in the amorphous Si layer, the filament comprising the metal element, and
   an inter layer between the $Si_xGe_{1-x}$ layer and the amorphous Si layer, the inter layer isolating crystal structures of the $Si_xGe_{1-x}$ layer and the amorphous Si layer from each other.

2. The device of claim 1,
   wherein the $Si_xGe_{1-x}$ layer has a polycrystalline structure.

3. The device of claim 1,
   wherein the $Si_xGe_{1-x}$ layer comprises boron.

4. The device of claim 1,
   wherein the first electrode comprises layers, and one of the layers is the $Si_xGe_{1-x}$ layer.

5. The device of claim 1,
   wherein the metal element is one selected from the group of Ag, Fe, Co, Ni, Cu, Ag, Au, and Zn.

6. The device of claim 1,
wherein the amorphous Si layer is nondoped amorphous Si.

7. The device of claim 1,
wherein the first electrode comprises a crystallized Si layer between the $Si_xGe_{1-x}$ layer and the inter layer.

8. The device of claim 1,
wherein a thickness of the inter layer is within a range of 0.3 to 3 nm.

9. The device of claim 1, further comprising:
an inter layer between the $Si_xGe_{1-x}$ layer and the amorphous Si layer, the inter layer is one selected from the group of a silicon oxide, a silicon oxynitride and a silicon.

10. The device of claim 1, further comprising:
an inter layer between the $Si_xGe_{1-x}$ layer and the amorphous Si layer, the inter layer is one selected from the group of a silicon oxide, a silicon oxynitride, a silicon nitride, an alumina, a hafnium oxide, a zirconium oxide, a titanium oxide, a lanthanum oxide, a praseodymium oxide and a dysprosium oxide.

11. The device of claim 1, further comprising:
an inter layer between the $Si_xGe_{1-x}$ layer and the amorphous Si layer, the inter layer is one selected from the group of a hafnium silicon oxide, a zirconium silicon oxide, a titanium silicon oxide, a lanthanum silicon oxide, a praseodymium silicon oxide, a dysprosium silicon oxide, a hafnium aluminum oxide, a zirconium aluminum oxide, a titanium aluminum oxide, a lanthanum aluminum oxide, a praseodymium aluminum oxide, a dysprosium aluminum oxide, a lanthanum aluminum silicon oxide, a praseodymium aluminum silicon oxide, a dysprosium aluminum silicon oxide, a hafnium silicon oxynitride, a zirconium silicon oxynitride and a titanium silicon oxynitride.

12. A memory device comprising:
a first electrode including a crystallized $Si_xGe_{1-x}$ layer (0≤x<1);
a second electrode including a metal element;
a variable resistance part between the first and second electrode, the part including an amorphous Si layer; and
a control circuit controlling a filament in the amorphous Si layer, the filament including the metal element,
wherein the $Si_xGe_{1-x}$ layer (except for x=0) has a concentration gradient in its composition in which a Si concentration is highest at a portion closest to the amorphous Si.

13. The device of claim 1, further comprising:
a first conductive line which is connected to the first electrode and extends in a first direction; and
a second conductive line which is connected to the second electrode and extends in a second direction which intersects the first direction.

14. The device of claim 1, further comprising:
a first conductive line which is connected to the first electrode and extends in a first direction;
a second conductive line which is connected to the second electrode and extends in a second direction which intersects the first direction; and
a rectifying unit which is disposed between the first and second conductive lines and connected serially to the variable resistance part.

15. The device of claim 1, further comprising:
a conductive line which is connected to one of the first and second electrodes and extends in a first direction; and
a FET of which a source/drain is connected to the other one of the first and second electrodes and a gate of the FET extends in a second direction which intersects the first direction.

16. A method of executing a set operation and a reset operation of the device of claim 1,
the set operation comprising:
making a voltage of the second electrode to a value higher than a voltage of the first electrode; and
increasing current between the first and second electrodes,
the reset operation comprising:
making a voltage of the first electrode to a value higher than a voltage of the second electrode.

17. A method of manufacturing the device of claim 1, comprising:
forming an amorphous $Si_xGe_{1-x}$ layer (0≤x<1);
changing the amorphous $Si_xGe_{1-x}$ layer to the crystallized $Si_xGe_{1-x}$ layer of the claim 1 by an anneal in a temperature lower than a temperature in which Si is crystallized; and
forming the amorphous Si layer on the crystallized $Si_xGe_{1-x}$ layer.

18. A method of manufacturing the device of claim 1, comprising:
forming an amorphous $Si_xGe_{1-x}$ layer (0≤x<1);
forming the inter layer on the amorphous $Si_xGe_{1-x}$ layer;
changing the amorphous $Si_xGe_{1-x}$ layer to the crystallized $Si_xGe_{1-x}$ layer of the claim 1 by an anneal in a temperature lower than a temperature in which Si is crystallized; and
forming the amorphous Si layer on the inter layer.

19. A method of manufacturing the device of claim 7, comprising:
forming an amorphous $Si_xGe_{1-x}$ layer (0≤x<1);
forming an amorphous Si layer on the amorphous $Si_xGe_{1-x}$ layer;
changing the amorphous $Si_xGe_{1-x}$ layer and the amorphous Si layer to the crystallized $Si_xGe_{1-x}$ layer and the crystallized Si layer by an anneal in a temperature lower than 600° C.;
forming the inter layer on the crystallized Si layer; and
forming the amorphous Si layer on the inter layer.

* * * * *